(12) United States Patent
Emoto

(10) Patent No.: US 6,552,773 B2
(45) Date of Patent: Apr. 22, 2003

(54) STAGE SYSTEM WITH DRIVING MECHANISM, AND EXPOSURE APPARATUS HAVING THE SAME

(75) Inventor: Keiji Emoto, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/736,403

(22) Filed: Dec. 15, 2000

(65) Prior Publication Data

US 2001/0001248 A1 May 17, 2001

Related U.S. Application Data

(63) Continuation of application No. 09/294,327, filed on Apr. 20, 1999.

(30) Foreign Application Priority Data

Apr. 23, 1998 (JP) ............................................ 10-113256

(51) Int. Cl.⁷ ........................ G03B 27/42; G03B 27/52; G03B 27/58; G03B 27/62
(52) U.S. Cl. ............................ 355/53; 355/30; 355/72; 355/75
(58) Field of Search ........................ 355/30, 53, 72–76, 355/55, 77; 310/10, 12; 378/34, 35; 318/650

(56) References Cited

U.S. PATENT DOCUMENTS

| | | | |
|---|---|---|---|
| 4,720,732 A | 1/1988 | Tsutsui ........................ 355/30 |
| 5,063,582 A * | 11/1991 | Mori et al. ................... 378/34 |
| 5,134,436 A | 7/1992 | Fujioka ........................ 355/40 |
| 5,231,291 A * | 7/1993 | Amemiya et al. ........ 250/443.1 |
| 5,345,999 A | 9/1994 | Hosokawa .................. 165/80.2 |
| 5,481,170 A | 1/1996 | Edelen et al. ............... 318/650 |
| 5,577,552 A | 11/1996 | Ebinuma et al. ............ 165/296 |
| 5,610,965 A | 3/1997 | Mori et al. ................... 378/34 |
| 5,770,899 A | 6/1998 | Hayashi ....................... 310/12 |
| 5,864,386 A | 1/1999 | Nei .............................. 355/30 |
| 5,877,843 A | 3/1999 | Takagi ......................... 355/30 |
| 5,894,341 A | 4/1999 | Nishi et al. .................. 355/68 |
| 6,002,987 A | 12/1999 | Kamiya et al. .............. 702/56 |
| 6,025,658 A | 2/2000 | Kamata ....................... 310/12 |
| 6,310,934 B1 * | 10/2001 | Hara et al. ................... 378/34 |

FOREIGN PATENT DOCUMENTS

| JP | 7-302124 | 11/1995 |
|---|---|---|
| JP | 7-302747 | 11/1995 |
| JP | 9-320934 | 12/1997 |

* cited by examiner

*Primary Examiner*—Henry Hung Nguyen
(74) *Attorney, Agent, or Firm*—Fitzpatrick, Cella, Harper & Scinto

(57) ABSTRACT

An exposure apparatus includes a control device for controlling an operation of the exposure apparatus, a temperature adjusting device for adjusting temperature in a predetermined portion in which temperature is changeable with operation of the exposure apparatus, and a calculator for calculating an adjusting amount of the temperature adjusting device to the predetermined portion, prior to an occurrence of a temperature change in the predetermined portion, on the basis of a signal produced by the control device, the signal being able to control the operation of the exposure apparatus.

20 Claims, 8 Drawing Sheets

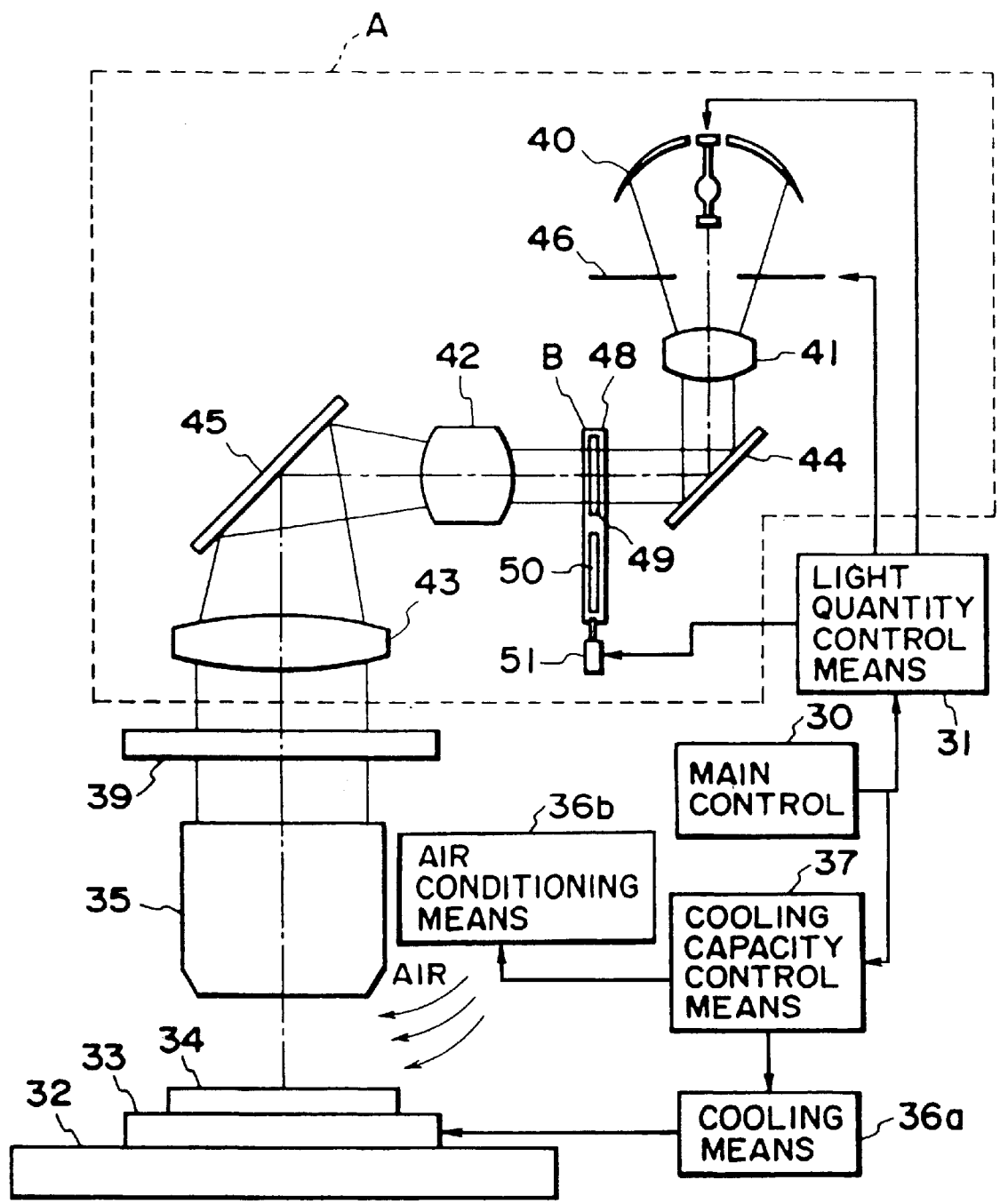
F I G. 5A

STAGE SYSTEM WITH DRIVING MECHANISM, AND EXPOSURE APPARATUS HAVING THE SAME

This application is a continuation of copending application Ser. No. 09/294,327, filed Apr. 20, 1999.

FIELD OF THE INVENTION AND RELATED ART

This invention relates to a driving system to be mounted on a positioning system which is required to perform precise positioning. In another aspect, the invention is concerned with an exposure apparatus or a device manufacturing method, for accurately transferring a reticle pattern to a wafer.

As regards the positioning precision, currently a nanometer (nm) order is required. For example, if a low thermal expansion material (thermal expansion coefficient $1\times10^{-6}$) of a size of 100 mm deforms by 100 nm in response to a temperature change of 1° C. and even if a change in temperature of air in the light path of an optical interference type distance gauge is 1° C., a measured value of position may change by 100 nm, depending on conditions. It is, therefore, necessary to use a cooling mechanism for collecting heat as radiated from a driving system, to prevent a temperature change.

Heat generation of a driving system produces thermal deformation of a structure or fluctuation of air, causing an error factor for the optical interference type distance gauge. In consideration of this, a precise positioning system uses cooling means based on a cooling medium, a heat pipe or a Peltier element. The temperature or flow rate of the cooling medium, the temperature at the heat radiating portion of the heat pipe or the driving current to the Peltier element is controlled, so that a driving system or a system having such a driving system is maintained at a predetermined temperature against heat generation from the driving system. Particularly, as regards adjustment of the cooling capacity of a cooling system, temperature measuring means may be provided in the vicinity of a heat generation source and, on the basis of the temperature as measured, the cooling medium temperature or the flow rate of the medium may be adjusted to perform cooling for the whole driving system (Japanese Laid-Open Patent Application, Laid-Open No. 302124/1995 and Laid-Open No. 302747/1995).

FIG. 8 shows an example of such a driving system. As shown in the drawing, this driving system operates to perform precise positioning of an object 110, to be positioned, by use of position measuring means 112, a controller 114 and a driver 115. There is cooling means with components 106a, 106b and 106c, for circulating cooling media 103a, 103b and 103c, to collect heat generated by the driving means 101a. The temperature or flow rate of the cooling medium is adjusted on the basis of the temperature of the subject to be cooled, as measured by a temperature sensor 105 and temperature measuring means 102, so that the driving system as a whole can be kept uniformly at a predetermined temperature.

In this example, however, the driving system needs the use of the temperature sensor 105 and the temperature measuring means 102, and the structure is complicated. It causes the following inconveniences.

(1) The assembling procedure is complicated.
(2) The cost of the driving system as a whole increases.
(3) Since the temperature sensor is provided within a casing in which the cooling medium flows, structurally, it is not easy to meet any disorder of the sensor.

These inconveniences then lead to a problem of reliability or high cost.

Further, with the feedback control using a sensor, there is a time lag from heat generation to cooling, to a predetermined temperature. It is, therefore, insufficient to reduce the thermal influence to the driving system, to the structure around the driving system, or to the environment, for example.

SUMMARY OF THE INVENTION

It is an object of the present invention to provide an exposure apparatus of higher reliability and reduced cost, in which, with respect to the cooling of the apparatus, simplification of structure and reduction of cost are accomplished and also the cooling effect is significantly improved.

It is another object of the present invention to provide a device manufacturing method using such an exposure apparatus.

It is a further object of the present invention to provide a stage system or a driving system to be used in such an exposure apparatus.

In accordance with an aspect of the present invention, there is provided an exposure apparatus for transferring a pattern of an original to a substrate, comprising: a control device for controlling an exposure operation of said exposure apparatus; and a temperature adjusting mechanism for controlling temperature, wherein said temperature adjusting mechanism is controlled on the basis of a signal produced by said control device for the exposure operation.

In one preferred form of this aspect of the present invention, one of thermal amount and cooling amount to be required is predicted on the basis of the signal, and said temperature adjusting mechanism is controlled on the basis of it.

Said temperature adjusting mechanism may include a cooling mechanism for controlling at least one of a flow rate of a cooling medium and temperature of the cooling medium.

There may be a plurality of temperature adjusting mechanisms, each corresponding to said temperature adjusting mechanism, for controlling temperatures of plural subjects to be controlled, wherein said temperature adjusting mechanisms may be controlled on the basis of a signal produced by said control device in relation to the subjects, for the exposure operation.

Said control device may include a drive controlling system for controlling a driving mechanism for performing drive of a stage, wherein, on the basis of a signal applied from said drive controlling system to said driving mechanism, a temperature adjusting mechanism for controlling a temperature of said driving mechanism may be controlled.

Said exposure apparatus may further comprise a drive controlling system for controlling a driving mechanism for performing drive of a stage, wherein, on the basis of a signal applied from said control device to said driving mechanism, a temperature adjusting mechanism for controlling a temperature of said driving mechanism may be controlled.

Said control device may include an exposure amount controlling system for controlling an exposure amount of an illumination optical system, wherein said temperature adjusting mechanism may be controlled on the basis of a signal produced by said exposure amount controlling system.

Said exposure apparatus may further comprise an exposure amount controlling system for controlling an exposure amount of an illumination optical system, wherein said temperature adjusting mechanism may be controlled on the basis of a signal applied from said control device to said exposure amount controlling system.

Said temperature adjusting mechanism may include means for adjusting temperature of one of the substrate and a holding member for holding the substrate.

Said temperature adjusting mechanism may include means for adjusting temperature inside said exposure apparatus.

Said temperature adjusting mechanism may be controlled on the basis of a signal produced by said control device for the exposure operation and a signal produced by a temperature measuring sensor.

In accordance with another aspect of the present invention, there is provided a device manufacturing method, comprising the steps of: producing, with a control device, a signal for an exposure operation; controlling a temperature adjusting mechanism for controlling temperature, on the basis of the signal; and transferring a pattern formed on an original to a substrate.

In one preferred form of this aspect of the present invention, the method further comprises predicting one of thermal amount and cooling amount to be required, on the basis of the signal.

The method may further comprise applying a resist to a wafer before an exposure operation, and developing the wafer after the exposure operation.

In accordance with a further aspect of the present invention, there is provided a driving system, comprising: a driving mechanism for producing a driving force; a drive controlling device for controlling said driving mechanism; and a temperature adjusting mechanism collecting heat from said driving mechanism, wherein a cooling amount of said temperature adjusting mechanism is controlled on the basis of a signal applied from said drive controlling device to said driving mechanism.

In one preferred form of this aspect of the present invention, said temperature adjusting mechanism is controlled on the basis of prediction of one of a cooling amount to be required for said driving mechanism and a thermal amount to be produced by said driving mechanism.

Said temperature adjusting mechanism may control at least one of a flow rate of a cooling medium and temperature of the cooling medium.

Said driving mechanism may include a linear motor.

Said linear motor may comprise a multi-phase type linear motor having plural coils, wherein said temperature adjusting mechanism may be operable to control temperatures of said coils, respectively, and wherein a cooling amount in relation to each coil may be controlled on the basis of a signal applied to the coil or a driver for energizing the coil.

Said temperature adjusting mechanism may be controlled on the basis of a signal produced by said control device for the exposure operation and a signal produced by a temperature measuring sensor.

In accordance with a yet further aspect of the present invention, there is provided a stage system, comprising: a movable stage; a driving mechanism for producing a driving force for said movable stage; a drive controlling device for controlling said driving mechanism; and a temperature adjusting mechanism collecting heat from said driving mechanism, wherein a cooling amount of said temperature adjusting mechanism is controlled on the basis of a signal applied from said drive controlling device to said driving mechanism.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 5A is a schematic view of an exposure apparatus according to a third embodiment of the present invention.

DESCRIPTION OF THE PREFERRED EMBODIMENTS

Preferred embodiments of the present invention will now be described with reference to the accompanying drawings.
[Embodiment 1]

Figure 1A:
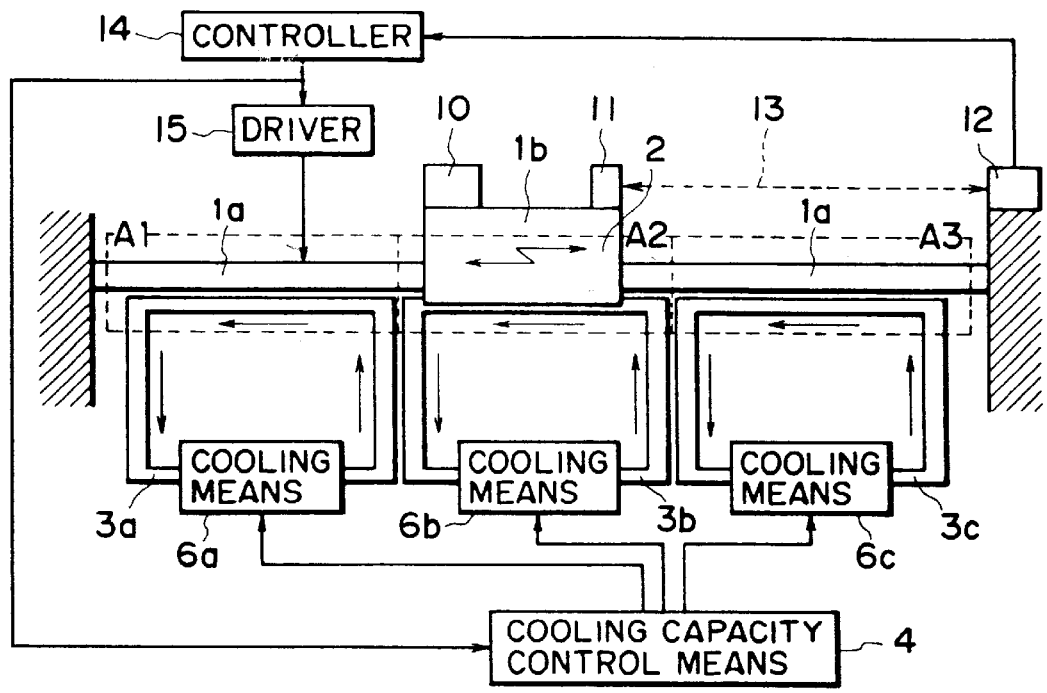
FIG. 1A is a schematic and diagrammatic view of a driving system according to a first embodiment of the present invention.

FIG. 1A is a schematic and diagrammatic view of a driving system according to a first embodiment of the present invention, and it best shows the features of the present invention.

Denoted in FIG. 1A at 1*a* and 1*b* are a pair of driving means, wherein denoted at 1*a* is driving means at a stationary side while denoted at 1*b* is driving means at a movable side, which is movable leftwardly and rightwardly as viewed in the drawing.

Denoted at 10 is a workpiece which is placed on a stage 2. The stage 2 has mounted thereon a movable portion 1*b* of the driving means. Denoted at 11 is a positional reference for the workpiece 10 placed on the stage 2. Denoted at 12 is position measuring means for measuring the position of the workpiece 10 in relation to the positional reference 11. Denoted at 13 is the length to be measured by the position measuring means 12. Denoted at 14 is a controller for producing a driving signal for controlling the driving amount of a driving device on the basis of positional data of the workpiece 10, as obtained by the position measuring means 12. Denoted at 15 is a driver for driving the driving means 1*a* and 1*b* in accordance with a driving signal from the controller 14.

Denoted at 3*a* is a supply side cooling medium, for cooling the driving means 1*a* and 1*b*. Denoted at 3*b* is a return side cooling medium, for cooling the driving means 1*a* and 1*b*. Denoted at 4 is cooling amount (capacity) controlling means for producing a control signal for controlling the temperature of the cooling medium 3*a*. Denoted at 6*a*, 6*b*, and 6*c* are cooling means for flowing a cooling medium of a predetermined temperature on the basis of a control signal from the cooling amount controlling means 4.

As the movable portion 1b moves leftwardly or rightwardly, as viewed in the drawing, relative to the stationary portion 1a of the driving means, the workpiece 10 moves in the same direction. The position of the workpiece 10 is measured by the position measuring means 12 using the positional reference 11 as a reference. For example, the positional reference may be provided by a reflection mirror while the position measuring means 12 may comprise a laser interferometer. On that occasion, the length 13 defines an optical path length which represents the relative position of the workpiece 10. Generally, the workpiece 10 and the positional reference 11 is spaced by a certain small distance, and the position of the workpiece 10 is calculated with reference to this positional reference 11. Therefore, the distance between them results in a positioning error. The controller 14 uses the positional data of the position measuring means 12, and applies a driving signal to the driver 15 so that the workpiece 10 can be positioned at a predetermined position. On the basis of the thus applied driving signal, the driver 15 actuates the driving means 1a and 1b. At that moment, on the basis of the driving signal as applied from the controller 14 to the driver 15, the cooling amount of the cooling amount controlling means 4 is controlled to prevent a temperature change in the driving means 1a and 1b. For this control of cooling amount, the cooling means 6a, 6b and 6c operate to adjust the flow rate or temperature of the cooling media 3a, 3b and 3c.

If, for example, a driving signal from the controller 14 commands the driving means 1a to produce a large output, that is, when a large heat generation from the driving means 1a and thus a large temperature rise are expected, the flow rate of the cooling media 3a, 3b and 3c is increased or, alternatively, the temperature of the cooling media 3a–3c is decreased, to enlarge the cooling amount. If, on the other hand, the driving signal from the controller 14 commands the driving means 1a to produce not a large output, that is, when a low heat generation from the driving means 1a and thus a low temperature rise are expected, the flow rate of the cooling media 3a–3c is decreased or the temperature of the cooling media 3a–3c is increased, to thereby reduce the cooling amount. By doing so, a variation in temperature of the driving device or the structure around it, or of the environment of it, can be prevented. As the temperature of the cooling medium 3a decreases, the temperature difference between it and the driving means 1a and 1b (the subject to be cooled) enlarges, and this increases the heat transfer amount and enlarges the cooling capacity. Thus, the temperature of the driving device can be controlled on the basis of the temperature of the cooling medium 3a.

In this manner, the cooling amount is adjusted in accordance with a driving signal applied from the controller 14 to the driving means. This avoids the necessity of using a temperature sensor for detecting the temperature of the driving means 1a and 1b or the temperature surrounding it. The driving means can, therefore, be made quite simple. This is very effective to reduce the cost of the driving device as a whole. Further, if, as conventional, the cooling amount is adjusted on the basis of the temperature of the driving means 1a and 1b, there would occur a large time lag for the cooling of the driving means since the adjustment of the cooling amount starts after the temperature of the driving means 1a and 1b changes. With the control procedure of this embodiment, to the contrary, the temperature change is predicted before the temperature of the driving means changes and, on the basis of it, the cooling amount can be adjusted. This enables stable temperature control without a large time lag, and the temperature variation of the driving means 1a and 1b can be suppressed. Therefore, thermal deformation of the driving means 1a and 1b or of a structure around it, or degradation of positioning precision due to a temperature change in ambience can be prevented or reduced significantly.

Figure 1B:
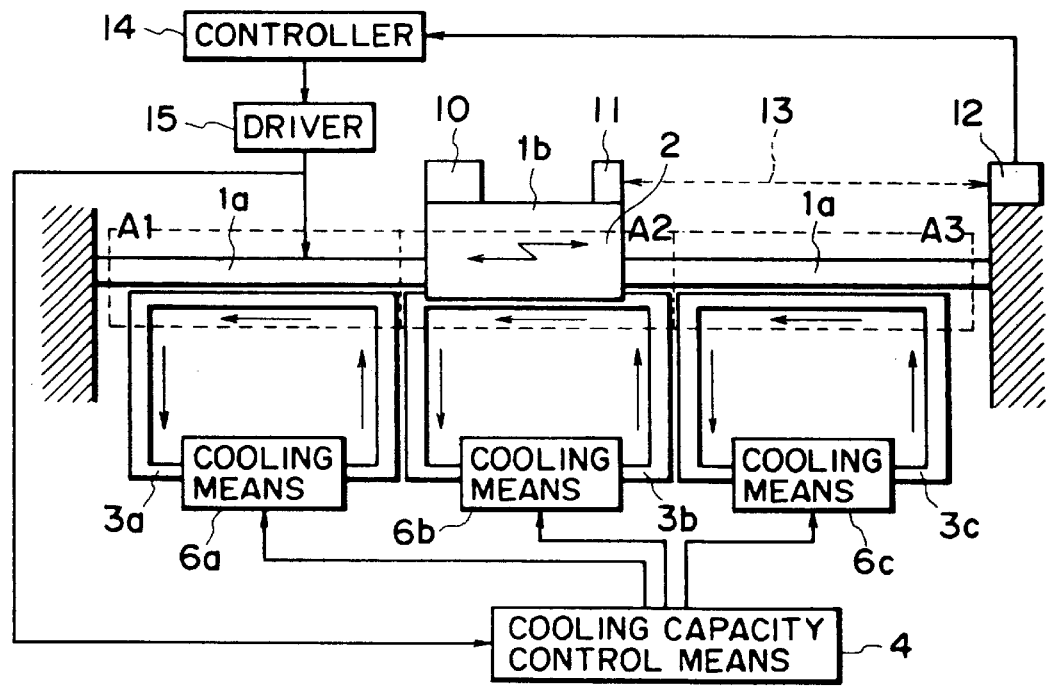
FIG. 1B is similar to FIG. 1A, and it shows a modified form of the FIG. 1A embodiment.

In this embodiment, the temperature controlling means controls the flow rate or temperature of the cooling medium on the basis of a driving signal from the controller to the driver. However, the invention is not limited to this form. Substantially the same advantageous results are attainable by controlling the temperature controlling means on the basis of a signal applied from the driver to the driving means, as illustrated in FIG. 1B. Namely, what is important is that the temperature controlling means be controlled on the basis of a signal which is to be used for control of the operation of the driving means.

Further, while in this embodiment the cooling amount is calculated forwardly on the basis of a driving signal from the controller, a separate temperature measuring means such as a temperature sensor may of course be provided. Prediction of the cooling amount may be performed on the basis of a signal from the controller and an output of the detecting means, so as to compensate for the detection result.

[Embodiment 2]

Figure 2:
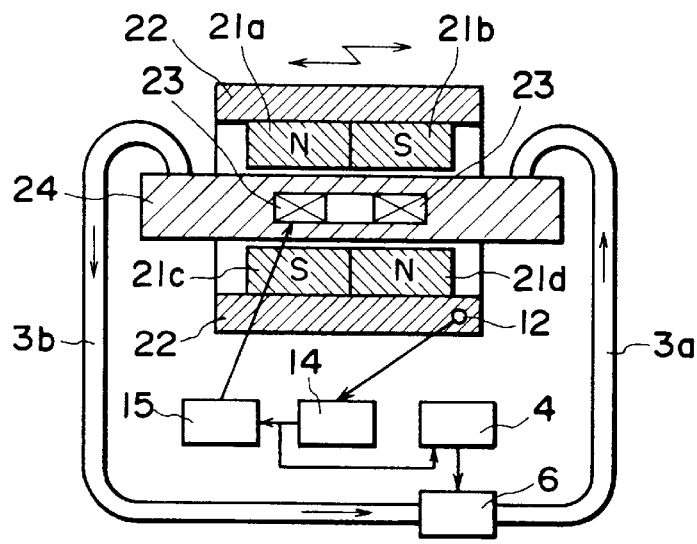
FIG. 2 is a schematic and diagrammatic view of a driving system according to a second embodiment of the present invention.

FIG. 2 is a schematic and diagrammatic view (partly in section) of a driving system according to a second embodiment of the present invention, which uses a linear motor as driving means.

Denoted at 21a, 21b, 21c and 21d are permanent magnets, and denoted at 22 is a yoke to which the magnets 21a–21d are fixedly mounted. Denoted at 23 is a coil through which an electric current flows. Denoted at 24 is a coil support for supporting the coil 23, and it provides a flow path for cooling media 3a and 3b. For energization of the linear motor system, a controller 14 applies a driving signal to a driver 15 so that an appropriate electric current is applied to the coil 23 in accordance with positional data as supplied from position measuring means 12. The driver 15 has a control function, for applying an appropriate electric current to the coil 2 in accordance with a driving signal voltage from the controller 14. Since the coil 23 is placed within the magnetic field as produced by the permanent magnets 21, as the electric current is applied to the coil 23, Lorentz forces are produced in leftward and rightward directions, as viewed in the drawing, such that the yoke 22 and the coil support 24 are relatively driven in leftward and rightward directions.

As the linear motor is driven, an electric current flows through the coil 23 and thus the coil 23 produces heat. In consideration of it, the amount of heat generation is predicted on the basis of the driving signal from the controller 14, and the cooling amount is adjusted. In this embodiment, it is considered that the amount of heat generation is approximately proportional to the output of the coil 23, and the heat generation of the coil 23 is determined from the output signal of the controller 14. This is taken as an index for the control of cooling amount. Denoted at 6 is cooling means for flowing a cooling medium of a predetermined temperature on the basis of a control signal from the cooling amount controlling means 4.

Figure 3:
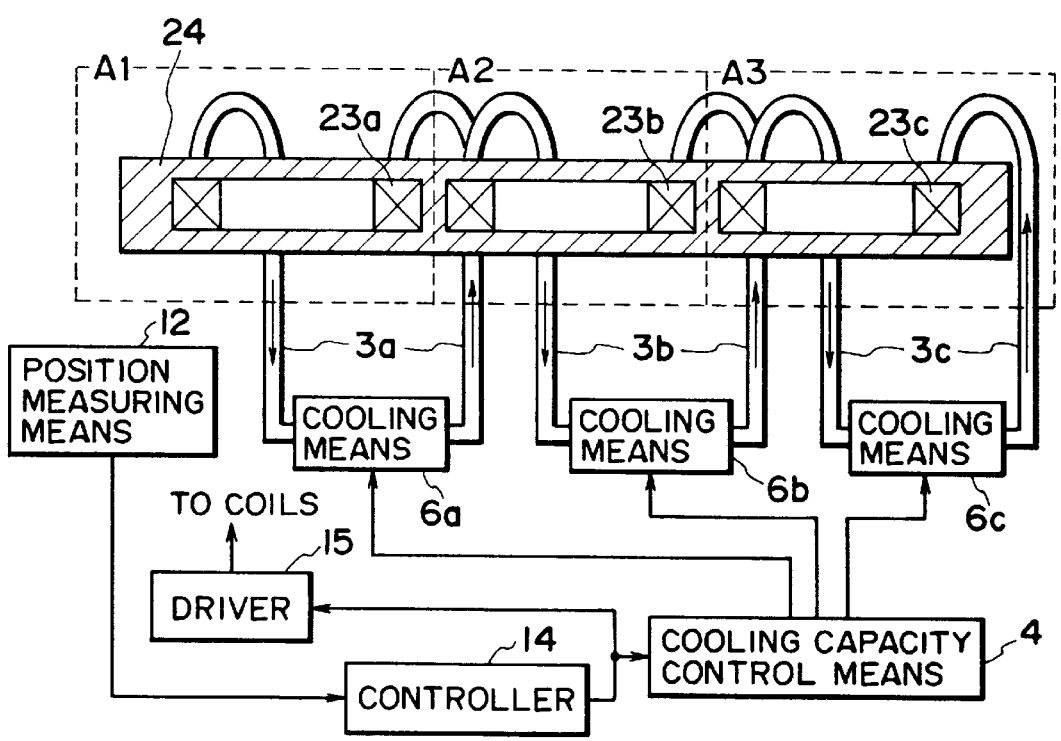
FIG. 3 is a schematic and diagrammatic view of a driving system with a multi-phase linear motor.

FIG. 3 is a schematic view of the structure of a driving system in an example where a multi-pole linear motor is used as driving means, and it shows details of a coil portion and cooling portion of the linear motor.

Denoted at 23a, 23b, and 23c are coils. In order to move a movable element (not shown), a controller 14 operates on the basis of a position signal supplied from position measuring means 12 to apply a driving signal to a driver 15. In accordance with this driving signal, the driver 15 controls electric currents to the coils. If a single-pole coil is used, the amount of heat generation of the whole driving system may be predicted on the basis of the output of the coil and the cooling amount for the whole driving system may be determined thereby. In the case of a multi-phase linear motor, on the other hand, there are plural coils, and electric currents to be applied to the coils are different from each other. Thus, there occur different temperature rises in them. In consideration of this, this embodiment is arranged to best utilize the advantage of separate cooling. More specifically, as shown in FIG. 3, the cooling region is divided in accordance with the coils 23a, 23b and 23c, and the cooling amount control means 4 is controlled on the basis of output signals from the controller. By this, the flow rate or temperature of the cooling medium in each cooling region is adjusted, thereby to adjust the cooling amount in each cooling region. Thus, for each coil, best cooling is accomplished.

In a conventional system, as compared therewith, a plurality of temperature sensors have to be used to perform the cooling for such divided regions, and it makes the structure quite complicated and also it results in an increase of cost. In this embodiment, however, division of the cooling region does not need an addition of sensors. A best cooling amount for each cooling region can be determined simply by calculating the outputs of the coils on the basis of driving signals from the controller.

Figure 4:
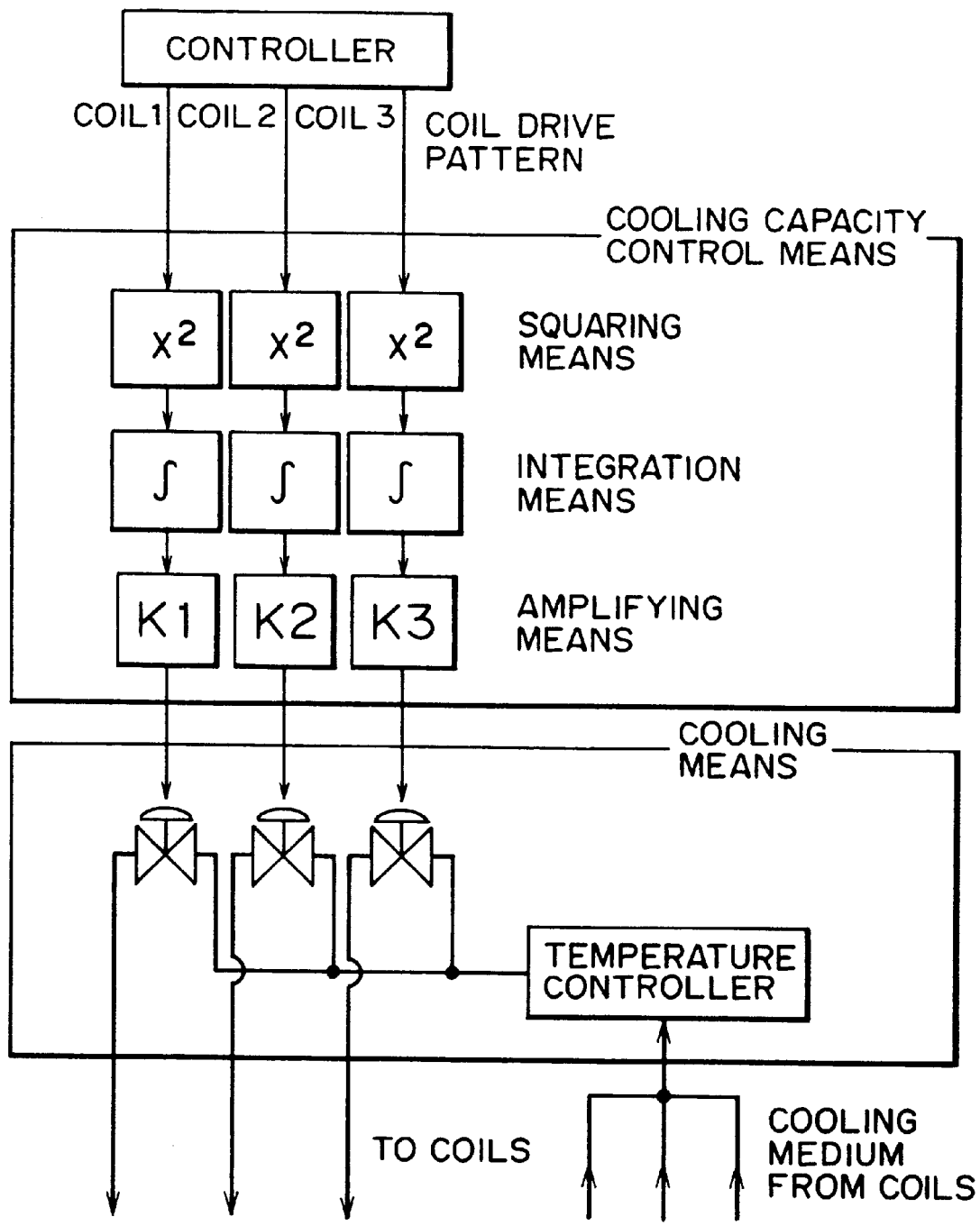
FIG. 4 is a schematic view for explaining an algorithm for a cooling system in the second embodiment of the present invention.

FIG. 4 illustrates an algorithm of temperature control in this embodiment.

Since the driving signal which is an output signal from the controller 14 represents an electric current flowing through the coil 23, the output of the coil 23 corresponds to the product of a square of the driving signal and an appropriate coefficient. For this reason, the amount of heat generation of the coil 23 can be considered as being proportional to the output of the coil 23, and in this respect the output of the coil 23 can be used as an index for the cooling amount. Also, since the output of the coil 23 changes largely with respect to time, as compared with the temperature change, the output of the coil 23 is integrated and, thereby, smoothed appropriately, such that an index suitable for use in temperature control can be provided. Thus, the cooling amount controlling means 4 operates to calculate a square of the driving signal from the controller 14 to the driver and then to perform integration of the obtained value. It functions thereafter to multiply the result of integration by a suitable coefficient, and a resultant value is signaled to the cooling means 6 as an index. In response, the cooling means controls the opening/closure of the valve, thereby to adjust the flow rate. In FIG. 4, the valve adjustment is accomplished on the basis of the driving signal. However, the invention is not limited to this form. The temperature of the cooling medium may be adjusted in accordance with the driving signal.

The cooling medium functions to directly cool the coil 23 (heat generation source) or the coil support 24 to collect the heat. Therefore, it provides an effect of suppressing temperature variation in the structure of the driving system or in the ambient air. Further, when the driving means comprises a linear motor, the output value of each coil may preferably be calculated from a control signal of the controller or of the driver and, on the basis of this value, the cooling amount (flow rate or temperature of the cooling medium) may be adjusted. This enables fine temperature control since the temperature rise in each coil can be predicted. Therefore, external disturbance such as an error in distance measurement due to thermal deformation or temperature variation can be reduced, and the positioning precision of the driving system can be improved.

While in this embodiment the cooling amount is calculated forwardly on the basis of a driving signal from the controller, a separate temperature measuring means such as a temperature sensor may of course be provided. Prediction of the cooling amount may be performed on the basis of a signal from the controller and an output of the detecting means, so as to compensate for the detection result.

[Embodiment 3]

FIG. 5A is a schematic and diagrammatic view of the main structure of an exposure apparatus according to a third embodiment of the present invention.

The exposure apparatus as a whole is assembled on a base table (not shown), mounted on a floor (the structure is not illustrated). Denoted at 32 is a wafer stage for carrying a wafer 34 thereon and for positioning the same. The wafer stage is operable to move a wafer chuck 33 and a wafer 34, held thereby by attraction, along a plane perpendicular to the optical axis of a projection lens 35. The position coordinates of the wafer stage 32 can be detected in accordance with a known method, using a laser interferometer, for example. Movement thereof to a specified position is controlled by means of a linear motor, not shown. Disposed above the projection lens 35 is a reticle 39 which is held by a reticle holding table (not shown). As light is projected from an illumination optical system A disposed above the reticle 39, a pattern formed on the reticle 39 is transferred to the surface of the wafer 34 through the projection lens 35.

The illumination optical system A includes first, second and third condenser lenses 41, 42 and 43 for uniformly illuminating the reticle 39 with light from an ultra-high pressure Hg lamp 40, as well as first and second mirrors 44 and 45 for deflecting the light. Shutter 46 serves to control the exposure.

The second and third condenser lenses 42 and 43 and the second mirror 45 are arranged to define a plane, at B in the drawing, which is optically conjugate with and in an imaging relation with the reticle pattern surface. By placing a masking at B, only a particular portion of the reticle 39 can be illuminated. At position B, there are a pattern exposure mask 49 and an alignment mark exposure mask 50 which are held by a frame 48 and which can be selectively inserted into the light flux, by means of switching drive of a cylinder 51.

The exposure amount or exposure condition of the illumination optical system is controlled by light quantity controlling means 31, in response to a signal from a main control 30 which controls the exposure apparatus. The light quantity controlling means 31 operates in response to a signal from the main control 30, to actuate the light source 40, the shutter 46 and the mask 49, for example, thereby to control the exposure amount or exposure condition as required for the illumination optical system.

As the wafer 34 is exposed, simultaneously it receives heat. This heat may cause thermal deformation of the wafer. If thermal deformation occurs in the wafer 34, it adversely affects precise exposure. In order to prevent this, the wafer chuck for holding the wafer 34 is equipped with cooling means for maintaining the wafer at a constant temperature.

Also, if temperature variation occurs inside the exposure apparatus, it may cause thermal deformation of components of the exposure apparatus. Additionally, the light path of a laser interferometer (not shown) for performing position measurement may be fluctuated. On that occasion, accurate position measurement is not attainable, and it adversely affects correct exposure. For these reasons, an air conditioning system 36b is required to keep the inside ambience of the exposure apparatus constant. In the illustrated example, there is an air conditioning system 36b for conditioning the air inside the exposure apparatus, particularly, between the projection optical system and the wafer.

The cooling amount controlling means 37 operates in accordance with a signal applied from the main control 30 to the light quantity controlling means 31, to calculate the flow rate or temperature of a cooling medium to be circulated by the cooling means, 36a, and also to calculate the flow rate or temperature of the air to be moved by the air conditioning system 36b. It supplies corresponding signals to temperature control mechanisms of the cooling means 36a and the air conditioning system 36b. Use of the output signal of the main control 30 applied to the exposure amount control means, for calculation of the cooling amount is because the heat amount applied to the wafer or temperature change inside the exposure apparatus is influenced mainly by the exposure amount or exposure condition of the illumination optical system.

In this embodiment, the cooling means 36a or air conditioning system 36b is controlled in accordance with a signal which is applied by the main control 30 to the light quantity controlling means 31. However, if there is a factor, other than the exposure amount, which is influential to the temperature of the wafer or the inside temperature of the exposure apparatus, calculation of the cooling amount may be made on the basis of a control signal for such a factor.

Further, in this embodiment, the temperature adjusting means has been described with reference to a wafer chuck cooling means or an air conditioning system in the exposure apparatus. However, the present invention is not limited to this form. For example, calculation of the cooling amount by the cooling means may be made with respect to driving means for moving the wafer stage, or driving means for moving the reticle, on the basis of a signal (driving signal) outputted by the main control system.

Figure 5B:
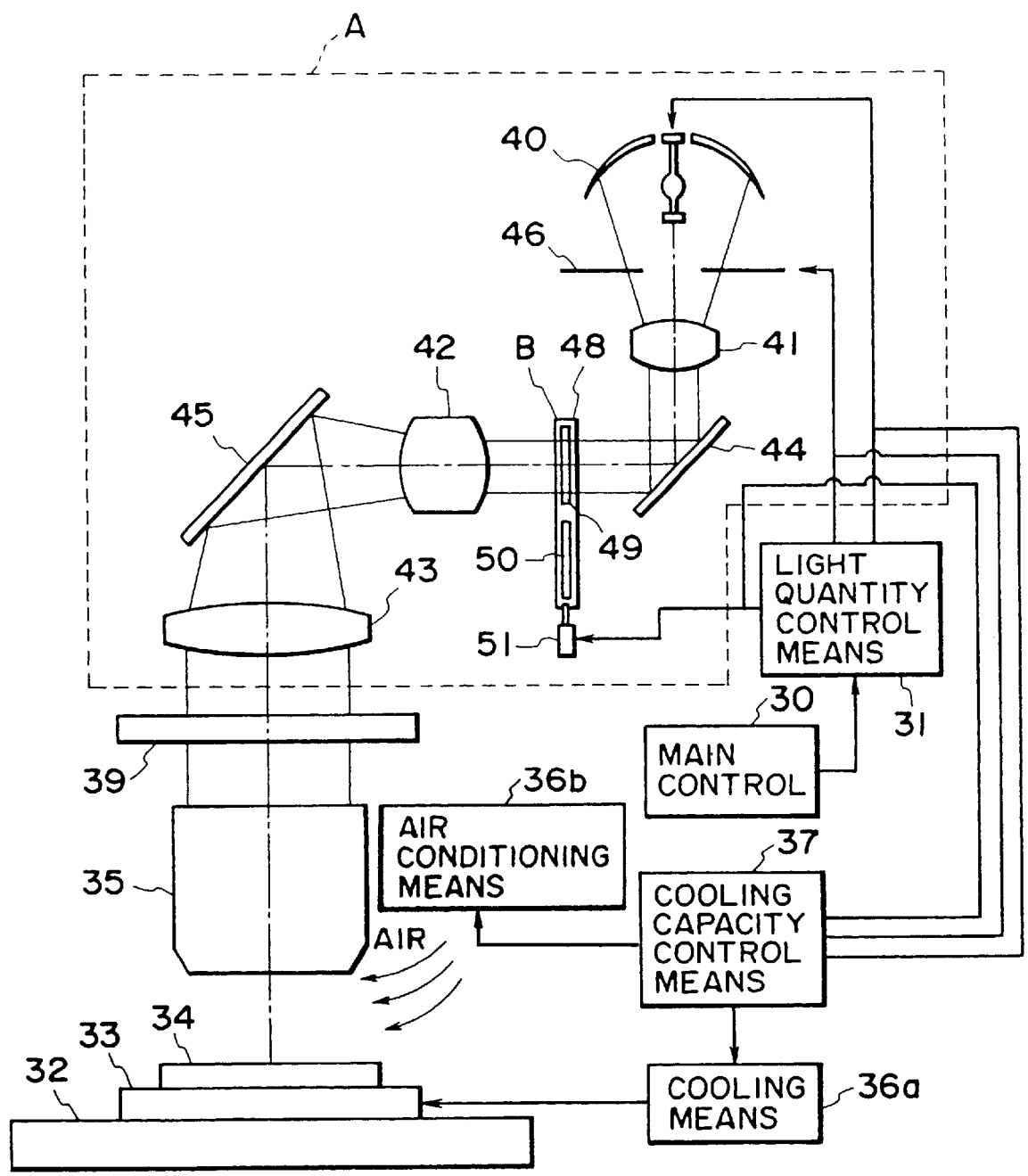
FIG. 5B is similar to FIG. 5A, and it shows a modified form of the FIG. 5A embodiment.

Further, while in this embodiment the cooling mechanism of the cooling means or of the air conditioning means is controlled in accordance with a signal applied from the main control to the light quantity controlling means, the invention is not limited to this. For example, the cooling mechanism may be controlled in accordance with a signal supplied to the light source, the shutter, or the mask from the light quantity controlling means in response to a signal from the main control, as illustrated in FIG. 5B.

In accordance with this embodiment, there is no necessity for using a light quantity sensor or a reflectivity measuring sensor for measurement of the exposure amount. Thus, the assembling procedure of the exposure apparatus can be very simple. Also, maintenance of the sensor is not necessary. Therefore, an exposure apparatus of reduced cost and improved stability can be provided.

Further, in accordance with this embodiment, the cooling amount is calculated on the basis of an exposure operation signal from the main control, and the temperature control is performed by predicting the amount of heat generation or temperature rise on the basis of the signal from the main control. Therefore, accurate temperature adjustment is attainable without a time lag. Also, a temperature change in each cooling region can be predicted, and adjustment of the cooling amount can be done with respect to each of the cooling regions. This enables high precision exposure.

While in this embodiment the cooling amount is calculated forwardly on the basis of a driving signal from the controller, a separate temperature measuring means such as a temperature sensor may of course be provided. Prediction of the cooling amount may be performed on the basis of a signal from the controller and an output of the detecting means, so as to compensate for the detection result.

[Embodiment 4]

Next, an embodiment of a semiconductor device manufacturing method which uses an exposure apparatus such as described above, will be explained.

Figure 6:
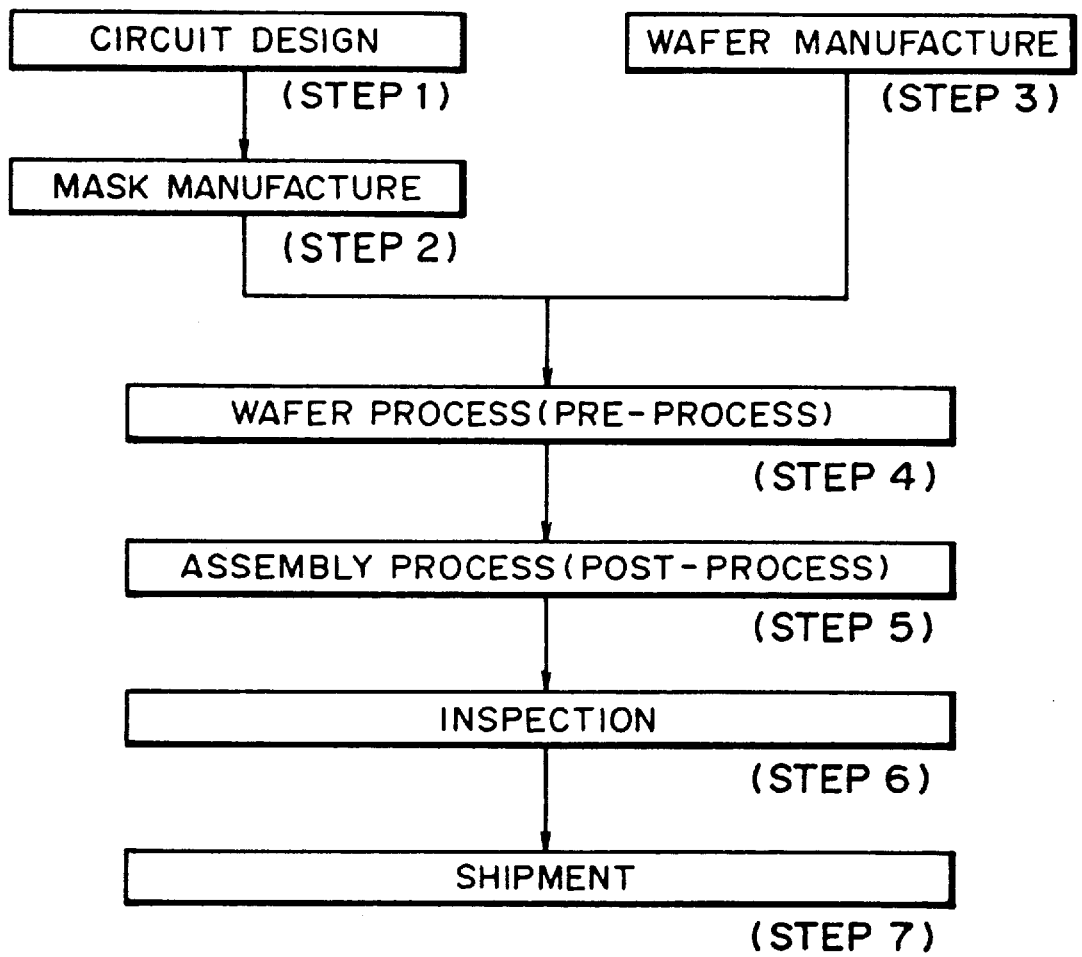
FIG. 6 is a flow chart of semiconductor device manufacturing processes.

FIG. 6 is a flow chart of a procedure for the manufacture of microdevices such as semiconductor chips (e.g., ICs or LSIs), liquid crystal panels, or CCDs, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 7:
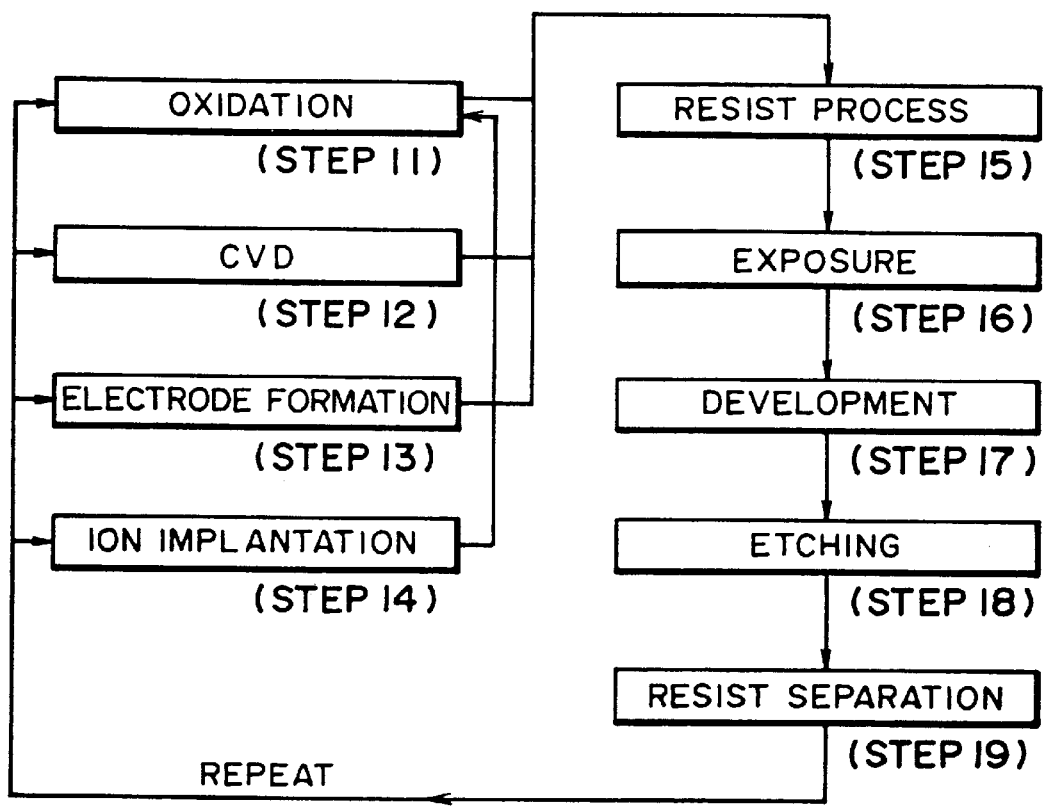
FIG. 7 is a flow chart of a wafer process.
Figure 8:
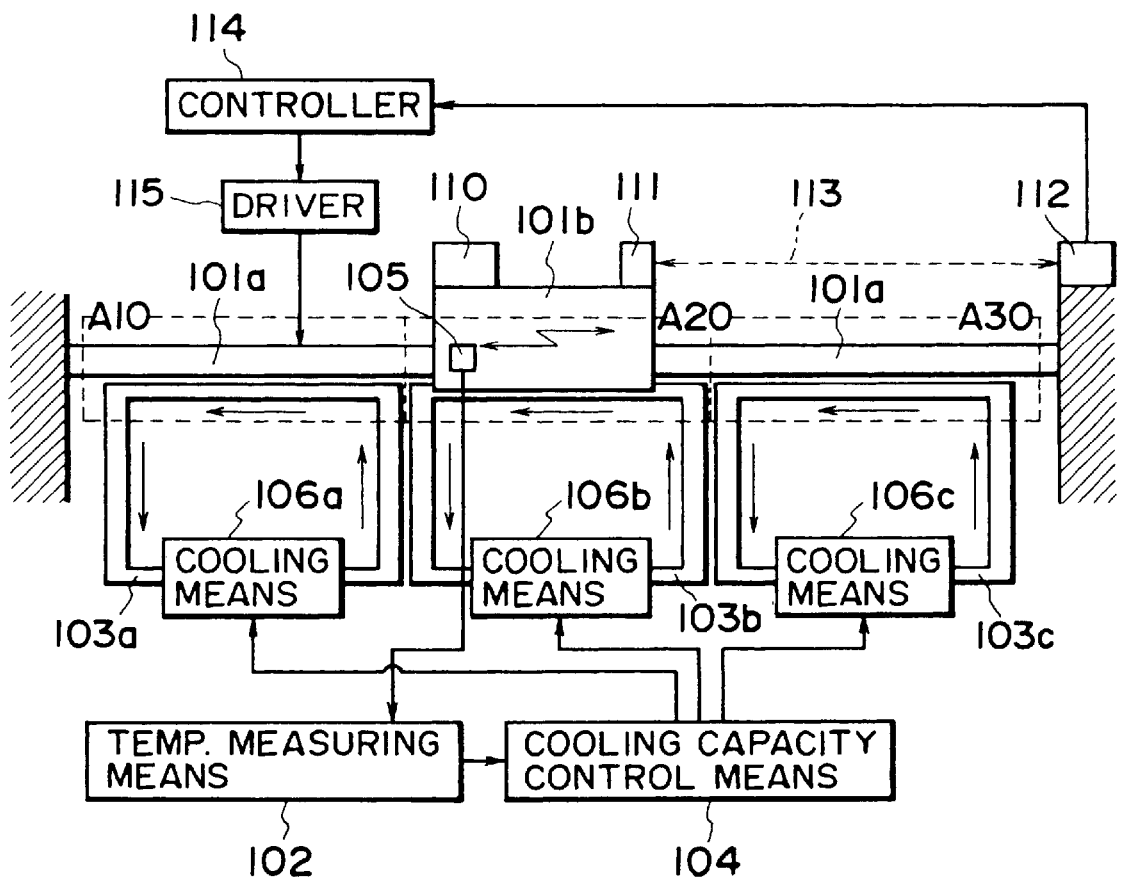
FIG. 8 is a schematic view and diagrammatic view of an example of a conventional driving system.

FIG. 7 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions onto the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus comprising:
    a control device for controlling an operation of said exposure apparatus;
    a temperature adjusting device for adjusting temperature in a predetermined portion in which temperature is changeable with operation of said exposure apparatus; and
    a calculator for calculating an adjusting amount of said temperature adjusting device to the predetermined portion, prior to an occurrence of a temperature change in the predetermined portion, on the basis of a signal produced by said control device, the signal being able to control the operation of said exposure apparatus.

2. An apparatus according to claim 1, further comprising a temperature sensor for sensing a temperature of said apparatus and for producing an output, wherein said calculator calculates the adjusting amount of said temperature adjusting device on the basis of the signal produced by said control device and the output of said sensor.

3. An apparatus according to claim 1, wherein said temperature adjusting device includes a cooling device for controlling at least one of a flow rate of a cooling medium and a temperature of the cooling medium.

4. An apparatus according to claim 1, further comprising a plurality of temperature adjusting devices for controlling temperatures of plural subjects to be controlled, wherein said calculator controls said temperature adjusting devices on the basis of a signal produced by said control device in relation to the subjects, for the exposure operation.

5. An apparatus according to claim 1, further comprising a driving mechanism for performing drive of a stage and a temperature adjusting mechanism for controlling a temperature of said driving mechanism, wherein said control device includes a drive controlling system for controlling said driving mechanism, and, on the basis of a signal applied from said drive controlling system to said driving mechanism, said temperature adjusting mechanism controls a temperature of said driving mechanism.

6. An apparatus according to claim 1, further comprising (i) a driving mechanism for performing drive of a stage, (ii) a temperature adjusting mechanism for controlling a temperature of said driving mechanism and (iii) a drive controlling system for controlling said driving mechanism, wherein, on the basis of a signal applied from said control device to said driving mechanism, said temperature adjusting mechanism controls a temperature of said driving mechanism.

7. An apparatus according to claim 1, wherein said control device includes an exposure amount controlling system for controlling an exposure amount of an illumination optical system, and said temperature adjusting device is controlled on the basis of a signal produced by said exposure amount controlling system.

8. An apparatus according to claim 1, further comprising an exposure amount controlling system for controlling an exposure amount of an illumination optical system, wherein said control device applies a signal to said exposure amount controlling system to control said temperature adjusting device.

9. An apparatus according to claim 8, wherein said temperature adjusting device includes means for adjusting temperature of one of a substrate and a holding member for holding the substrate.

10. An apparatus according to claim 8, wherein said temperature adjusting device includes means for adjusting temperature inside said exposure apparatus.

11. An apparatus according to claim 1, further comprising a temperature measuring sensor for measuring temperature of said apparatus, wherein said temperature adjusting device is controlled on the basis of a signal produced by said control device for the exposure operation and a signal produced by said temperature measuring sensor.

12. A driving system, comprising:
a driving mechanism;
a control device for controlling an operation of said driving mechanism;
a temperature adjusting device for adjusting temperature in a predetermined portion in which temperature is changeable with the operation of said driving mechanism; and
a calculator for calculating an adjusting amount of said temperature adjusting device to the predetermined portion, prior to an occurrence of a temperature change in the predetermined portion, on the basis of a signal produced by said control device, the signal being able to control the operation of said driving mechanism.

13. A driving system according to claim 12, further comprising a temperature sensor for sensing a temperature of said driving mechanism and for producing an output, wherein said calculator calculates the adjusting amount of said temperature adjusting device on the basis of the output of said sensor.

14. A driving system according to claim 12, wherein said temperature adjusting device controls at least one of a flow rate of a cooling medium and a temperature of the cooling medium.

15. A driving system according to claim 12, wherein said driving mechanism includes a linear motor.

16. A driving system according to claim 15, wherein said linear motor comprises a multi-phase type linear motor having plural coils, said temperature adjusting device controls temperatures of said coils, respectively, and further comprising a controller for controlling a cooling amount in relation to each coil on the basis of a signal applied to the coil or a driver for energizing the coil.

17. A driving system according to claim 12, further comprising a control device for controlling an exposure operation and a temperature sensor for measuring temperature of the exposure operation, wherein said temperature adjusting device is controlled on the basis of a signal produced by said control device for the exposure operation and a signal produced by said temperature sensor.

18. A device manufacturing method, comprising the steps of:
adjusting, through a temperature adjusting device, a temperature of a predetermined portion in which temperature is changeable with operation of an exposure apparatus;
calculating an adjusting amount of the temperature adjusting device to the predetermined portion, prior to an occurrence of a temperature change in the predetermined portion, on the basis of a signal being able to control the operation of the exposure apparatus; and
transferring a pattern of an original onto a substrate by use of the exposure apparatus.

19. A method according to claim 18, further comprising providing a temperature sensor for sensing a temperature of the exposure apparatus and producing a temperature signal, wherein said calculating step comprises calculating the adjusting amount of the temperature adjusting device on the basis of the temperature signal.

20. A method according to claim 18, further comprising applying a resist to a wafer before an exposure operation, and developing the wafer after the exposure operation.

* * * * *

UNITED STATES PATENT AND TRADEMARK OFFICE
CERTIFICATE OF CORRECTION

PATENT NO. : 6,552,773 B2
DATED : April 22, 2003
INVENTOR(S) : Keiji Emoto

It is certified that error appears in the above-identified patent and that said Letters Patent is hereby corrected as shown below:

Column 1,
Line 19, "by" should read -- of --.

Column 9,
Line 14, "means 36a." should read -- system 36b. --.
Line 48, "of" should read -- for --.
Line 51, "for" should read -- of --.
Line 63, "enable" should read -- enables --.

Column 10,
Line 32, "to" should read -- onto --.

Column 11,
Line 47, "the substrate" should read -- a substrate --.

Signed and Sealed this

Seventh Day of October, 2003

JAMES E. ROGAN
*Director of the United States Patent and Trademark Office*